United States Patent
Prentice et al.

(10) Patent No.: US 10,495,700 B2
(45) Date of Patent: Dec. 3, 2019

(54) METHOD AND SYSTEM FOR PROVIDING INFORMATION ABOUT A TARGET OBJECT IN A FORMATTED OUTPUT SIGNAL

(71) Applicant: Allegro Microsystems, LLC, Manchester, NH (US)

(72) Inventors: Seth Prentice, Epping, NH (US); Andrea Foletto, Annecy le Vieux (FR); Marcus Hagn, Offenbach (DE)

(73) Assignee: Allegro MicroSystems, LLC, Manchester, NH (US)

( * ) Notice: Subject to any disclaimer, the term of this patent is extended or adjusted under 35 U.S.C. 154(b) by 750 days.

(21) Appl. No.: 15/010,453

(22) Filed: Jan. 29, 2016

(65) Prior Publication Data

US 2017/0219662 A1  Aug. 3, 2017

(51) Int. Cl.
| | |
|---|---|
| *G01R 33/07* | (2006.01) |
| *H03K 5/08* | (2006.01) |
| *H03K 7/08* | (2006.01) |
| *G08B 25/04* | (2006.01) |

(52) U.S. Cl.
CPC .............. *G01R 33/07* (2013.01); *H03K 5/08* (2013.01); *H03K 7/08* (2013.01); *G08B 25/045* (2013.01)

(58) Field of Classification Search
CPC . G01R 33/07; H03K 5/08; H03K 7/08; H03K 7/10; G08B 25/045; G08C 19/16;
(Continued)

(56) References Cited

U.S. PATENT DOCUMENTS

| | | |
|---|---|---|
| 3,304,434 A | 2/1967 | Koster |
| 4,225,939 A | 9/1980 | Yashiro |
| | (Continued) | |

FOREIGN PATENT DOCUMENTS

| | | |
|---|---|---|
| CN | 204989435 U | 1/2016 |
| DE | 25 18 054 | 11/1976 |
| | (Continued) | |

OTHER PUBLICATIONS

PCT Partial Search Report and Written Opinion for PCT Appl. No. PCT/US2017/032840 dated Aug. 9, 2017; 16 pages.
(Continued)

*Primary Examiner* — Huy Q Phan
*Assistant Examiner* — Dustin R Dickinson
(74) *Attorney, Agent, or Firm* — Daly, Crowley, Mofford & Durkee, LLP

(57) ABSTRACT

The present disclosure is directed to methods and systems for providing information about a target based on pulse widths. The information can be provided in a formatted output signal which uses a pulse width protocol to code information by varying amplitudes and widths of successive pulses in an output signal pulse train portion. The method includes detecting a first feature of the target and in response to detecting the first feature, generating an output signal pulse train portion comprising two or more pulses with at least two of the pulses having different amplitudes and each of the two or more pulses having a width corresponding to a logic value. The widths of the two or more pulses in the output signal pulse train portion can be measured in response to the detected first feature reaching a first amplitude threshold, whereby the widths can correspond to different logic values.

30 Claims, 8 Drawing Sheets

(58) Field of Classification Search
CPC ........ G08C 19/18; G08C 19/22; G01D 5/145;
G01P 3/00; G01P 3/481; G01P 21/02;
G01P 3/489
See application file for complete search history.

(56) References Cited

U.S. PATENT DOCUMENTS

| | | | |
|---|---|---|---|
| 4,283,679 A | 8/1981 | Ito et al. | |
| 4,513,403 A | 4/1985 | Troy | |
| 4,642,555 A | 2/1987 | Swartz et al. | |
| 4,649,796 A | 3/1987 | Schmidt | |
| 4,893,027 A | 1/1990 | Kammerer et al. | |
| 5,019,773 A | 5/1991 | Sugiura et al. | |
| 5,138,640 A | 8/1992 | Fleck et al. | |
| 5,244,834 A | 9/1993 | Suzuki et al. | |
| 5,332,956 A | 7/1994 | Oh | |
| 5,442,313 A | 8/1995 | Santos et al. | |
| 5,486,759 A | 1/1996 | Seiler et al. | |
| 5,696,790 A | 12/1997 | Graham et al. | |
| 5,761,206 A | 6/1998 | Kackman | |
| 5,781,005 A | 7/1998 | Vig et al. | |
| 6,242,604 B1 | 6/2001 | Hudlicky et al. | |
| 6,242,904 B1 | 6/2001 | Shirai et al. | |
| 6,242,905 B1 | 6/2001 | Draxelmayr | |
| 6,242,908 B1 | 6/2001 | Scheller | |
| 6,278,269 B1 | 8/2001 | Vig et al. | |
| 6,288,567 B1 | 9/2001 | Fink | |
| 6,297,627 B1 | 10/2001 | Towne et al. | |
| 6,339,322 B1 | 1/2002 | Loreck et al. | |
| 6,492,804 B2 | 12/2002 | Tsuge et al. | |
| 6,525,531 B2 | 2/2003 | Forrest et al. | |
| 6,542,847 B1 | 4/2003 | Lohberg et al. | |
| 6,642,847 B1 | 4/2003 | Lohberg et al. | |
| 6,590,384 B1* | 7/2003 | Draxelmayr ............ G01P 3/489 324/160 |
| 6,653,968 B1 | 11/2003 | Schneider | |
| 6,687,644 B1 | 2/2004 | Zinke et al. | |
| 6,788,221 B1 | 9/2004 | Ely et al. | |
| 6,815,944 B2 | 11/2004 | Vig et al. | |
| 6,822,588 B1* | 11/2004 | Marshall, Jr. ......... H03M 7/165 341/111 |
| 6,968,484 B2 | 11/2005 | Hummel | |
| 7,026,808 B2 | 4/2006 | Vig et al. | |
| 7,184,876 B2 | 2/2007 | Teulings et al. | |
| 7,199,579 B2 | 4/2007 | Scheller et al. | |
| 7,295,000 B2 | 11/2007 | Werth | |
| 7,319,418 B2 | 1/2008 | Fink | |
| 7,345,468 B2 | 3/2008 | Okada et al. | |
| 7,362,094 B2 | 4/2008 | Voisine et al. | |
| 7,365,530 B2 | 4/2008 | Bailey et al. | |
| 7,466,123 B2 | 12/2008 | Kato et al. | |
| 7,592,801 B2 | 9/2009 | Bailey et al. | |
| 7,800,389 B2 | 9/2010 | Friedrich et al. | |
| 7,830,278 B2* | 11/2010 | Lohberg ................ G01D 5/145 341/11 |
| 7,923,996 B2 | 4/2011 | Doogue et al. | |
| 8,030,918 B2 | 10/2011 | Doogue | |
| 8,577,634 B2 | 11/2013 | Donovan et al. | |
| 8,624,588 B2 | 1/2014 | Vig et al. | |
| 8,680,846 B2 | 3/2014 | Cesaretti et al. | |
| 8,754,640 B2 | 6/2014 | Vig et al. | |
| 8,860,404 B2 | 10/2014 | Dwyer et al. | |
| 8,994,369 B2 | 3/2015 | Vig et al. | |
| 9,068,859 B2 | 6/2015 | Dwyer et al. | |
| 9,151,771 B2 | 10/2015 | Vig et al. | |
| 9,222,990 B2 | 12/2015 | Dwyer et al. | |
| 2001/0002791 A1 | 6/2001 | Tsuge et al. | |
| 2001/0009367 A1 | 7/2001 | Seitzer et al. | |
| 2002/0027488 A1 | 3/2002 | Hayat-Dawoodi et al. | |
| 2003/0001563 A1 | 1/2003 | Turner | |
| 2004/0062362 A1 | 4/2004 | Matsuya | |
| 2004/0135220 A1 | 7/2004 | Goto | |
| 2005/0120782 A1 | 6/2005 | Kishibata et al. | |
| 2005/0179429 A1 | 8/2005 | Lohberg | |
| 2005/0225318 A1 | 10/2005 | Bailey et al. | |
| 2006/0136171 A1 | 6/2006 | Kaster et al. | |
| 2007/0139036 A1 | 6/2007 | Kondo | |
| 2009/0058404 A1 | 3/2009 | Kurumado | |
| 2009/0153137 A1 | 6/2009 | Bailey et al. | |
| 2009/0207923 A1* | 8/2009 | Dress ...................... H03K 7/08 375/259 |
| 2009/0251134 A1 | 10/2009 | Uenoyama | |
| 2009/0284256 A1* | 11/2009 | Butzmann ............. B82Y 25/00 324/252 |
| 2010/0211347 A1 | 8/2010 | Friedrich et al. | |
| 2011/0018533 A1 | 1/2011 | Cesaretti et al. | |
| 2012/0116664 A1 | 5/2012 | Shibata | |
| 2013/0214774 A1 | 8/2013 | Cesaretti et al. | |
| 2013/0335067 A1 | 12/2013 | Dwyer et al. | |
| 2013/0335068 A1 | 12/2013 | Dwyer et al. | |
| 2013/0335074 A1 | 12/2013 | Dwyer et al. | |
| 2014/0347045 A1* | 11/2014 | Paul ..................... G01R 33/072 324/251 |
| 2014/0358320 A1 | 12/2014 | Hammerschmidt | |
| 2015/0263659 A1 | 9/2015 | Chi | |
| 2015/0268263 A1 | 9/2015 | Rasbornig | |
| 2016/0011010 A1* | 1/2016 | Muthers ................ G01D 5/145 324/207.2 |

FOREIGN PATENT DOCUMENTS

| | | |
|---|---|---|
| DE | 3535842 A1 | 4/1987 |
| DE | 40 31 560 | 4/1992 |
| DE | 196 34 715 A1 | 3/1998 |
| DE | 196 50 935 A1 | 6/1998 |
| DE | 19650935 A1 | 6/1998 |
| DE | 198 38 433 | 3/1999 |
| DE | 19911774 A1 | 12/1999 |
| DE | 199 61 504 A1 | 6/2001 |
| DE | 19634714 B4 | 8/2007 |
| EP | 0 944 888 B1 | 10/2001 |
| EP | 0944888 B1 | 10/2001 |
| EP | 1 580 560 A1 | 9/2005 |
| EP | 1 582 560 A1 | 10/2005 |
| EP | 1600741 A2 | 11/2005 |
| EP | 1 662 353 A1 | 5/2006 |
| EP | 1600741 A3 | 5/2006 |
| GB | 2018538 | 10/1979 |
| JP | 63-300911 | 12/1988 |
| JP | H2-116753 | 5/1990 |
| JP | 02-149013 | 6/1990 |
| JP | H03-29817 | 2/1991 |
| JP | H06-273437 | 9/1994 |
| JP | 07-012582 | 1/1995 |
| JP | 10-332725 | 12/1998 |
| JP | 11-064363 | 3/1999 |
| JP | 2001-043475 | 2/2001 |
| JP | 2001/505691 A | 4/2001 |
| JP | 2001-165951 | 6/2001 |
| JP | 2002-117500 | 4/2002 |
| JP | 2002-357920 | 12/2002 |
| JP | 4093381 | 6/2008 |
| JP | 4142109 B2 | 8/2008 |
| JP | 4880874 | 12/2011 |
| WO | WO 88/09026 | 11/1988 |
| WO | WO 9825148 A2 | 6/1998 |
| WO | WO 99/49322 | 9/1999 |
| WO | WO 01/74139 A2 | 10/2001 |
| WO | WO 01/74139 A3 | 10/2001 |
| WO | WO 03/069358 A2 | 8/2003 |
| WO | WO 03/069358 A3 | 8/2003 |
| WO | WO 2005/013363 A2 | 2/2005 |
| WO | WO 2005/013363 A3 | 2/2005 |
| WO | WO 2008/145662 A1 | 12/2008 |
| WO | WO 2010/014309 A1 | 2/2010 |

OTHER PUBLICATIONS

Invitation to Pay Additional Fees with Partial Search Report dated Apr. 13, 2017 for International Application No. PCT/US2017/012241; 9 Pages.

(56) References Cited

OTHER PUBLICATIONS

PCT Search Report & Written Opinion of the ISA dated Jul. 6, 2017 for International Application No. PCT/US2017/012241; 25 Pages.
PCT Search Report and Written Opinion dated Nov. 7, 2017 for PCT Appl. No. PCT/US2017/032840; 24 pages.
Lequesne et al.; "High-Accuracy Magnetic Position Encoder Concept;" IEEE Transactions on Industry Applications; vol. 35, No. 3; May/Jun. 1999; pp. 568-576; 9 pages.
Infineon Technologies; "Differential Two-Wire Hall Effect Sensor IC;" TLE4942 Preliminary Data Sheet; Jun. 2000; 13 pages.
Robert Bosch GMBH Stuttgart; "Active Sensor for ABS/ASR/VDC-Systems with 2-Wire-Current Interface;" Specification TLE4941/TLE4942; Version 5; Jun. 25, 2000; 44 pages.
PCT Search Report dated Nov. 19, 2003 for PCT Pat. App. No. PCT/US03/02489 filed on Jan. 29, 2003; 9 pages.
EP Office Action dated Mar. 2, 2005 for EP 03 710 766.1; 8 pages.
Jeffrey et al.; "Sensor Testing Through Bias Superposition;" Science Direct, Sensors and Actuators, A 136; Feb. 6, 2007, pp. 441-455 from article; 15 pages.
JP Official Action dated Apr. 7, 2008 for JP 2003-568426; 55 pages.
JP Response to Official Action dated Sep. 22, 2008 for JP 2003-568426; 14 pages.
PCT Invitation to Pay Additional Fees dated Oct. 10, 2008 for PCT Pat. App. No. PCT/US03/02489 filed on Jan. 29, 2003; 3 pages.
JP Official Action dated Dec. 12, 2008 for JP 2003-568426; 4 pages.
JP Response to Official Action dated Mar. 25, 2009 for JP 2003-568426; 8 pages.
EP Summons to or Proceedings dated Apr. 30, 2009 for EP 03 710 766.1; 4 pages.
EP Response to Office Action submitted May 13, 2009 for EP 03 710 766.1; 2 pages.
EP Communication of Board of Appeals dated May 26, 2009 for EP 03 710 766.1; 52 pages.
PCT Search Report and Written Opinion of the ISA for PCT/US2009/048237 dated Aug. 25, 2009; 61 pages.
Allegros Microsystems, Inc. Data Sheet A1341; "High Precision, Highly Programmable Linear Hall Effect Sensor IC with EEPROM, Output Protocols SENT and PWM, and Advanced Output Linearization Capabilities;" May 17, 2010; 46 pages.
JP Office Action dated Nov. 16, 2010 from Application No. 2003-568426; 16 pages.
PCT International Preliminary Report on Patentability for PCT/US2009/048237 dated Feb. 1, 2011; 8 pages.
European Response filed Apr. 18, 2011 to PCT Written Opinion dated Aug. 25, 2009 for EP Patent Appl. No. 09789890.2; 11 pages.
Office Action dated May 12, 2011; for U.S. Appl. No. 12/183,367; 17 pages.
JP Amendment dated Jun. 9, 2011 for JP Pat. App. No. 2003-568426; 27 pages.
Response filed Aug. 10, 2011; to Office Action dated May 12, 2011; for U.S. Appl. No. 12/183,367; 13 pages.
Letter from Yuasa & Hara dated Aug. 31, 2011; for Japanese Pat. App. No. 2003-568426; 9 pages.
Letter to Yuasa and Hara dated Oct. 4, 2011; for Japanese Pat. App. No. 2003-568426; 1 page.
JP Response to Notice of Rejection; filed Oct. 11, 2011; for JP 2003-568426; 6 pages.
Allegro Microsystems, Inc. Data Sheet ATS601LSG; "Non-TPOS, Tooth Detecting Speed Sensor;" Nov. 1, 2011; 9 pages.
JP Notice of Allowance dated Nov. 8, 2011; for JP 2003-568426; 3 pages.
Office Action dated Oct. 20, 2011; for U.S. Appl. No. 12/183,367; 9 pages.
Response filed Jan. 17, 2012; to Office Action dated Oct. 20, 2011; for U.S. Appl. No. 12/183,367; 15 pages.

Office Action/Restriction Requirement dated Apr. 12, 2012; for U.S. Appl. No. 12/183,367; 6 pages.
CN Office Action dated May 3, 2012; for CN Pat. App. No. 200980129766.7; 15 pages.
Letter to NTD Patent and Trademark Agency Limited dated Aug. 29, 2012; Chinese Pat. App. No. 200980129766.7; 20 pages.
Response to Chinese Office Action received Oct. 18, 2012; for Chinese Pat. App. No. 200980129766.7; 11 pages.
Chinese Office Action dated Jan. 18, 2013; for CN Pat. App. No. 200980129766.7; 8 pages.
Letter from NTD Patent and Trademark Agency Limited dated Feb. 6, 2013; for Chinese Pat. App. No. 200980129766.7; 2 pages.
Response filed Feb. 6, 2013; to Office Action/Restriction Requirement dated Apr. 12, 2012; for U.S. Appl. No. 12/163,367; 4 pages.
Chinese Notice of Allowance; dated Mar. 6, 2013; for Chinese Pat. App. No. 200980189766.7; 4 pages.
Final Office Action dated May 2, 2013; for U.S. Appl. No. 12/183,367; 15 pages.
Response to Final Office Action dated May 2, 2013; for U.S. Appl. No. 12/183,367; 8 pages.
Final Office Action dated Jul. 1, 2013; for U.S. Appl. No. 12/183,367; 22 pages.
Final Office Action dated Jul. 23, 2013; for U.S. Appl. No. 12/183,367; 8 pages.
PCT Search Report and Written Opinion of the ISA; dated Aug. 12, 2013; for PCT Pat. App. No. PCT/US2013/044025; 12 pages.
Response to Final Office Action filed Aug. 27, 2013; to Office Action dated Jul. 23, 2013; for U.S. Appl. No. 12/183,367; 13 pages.
Notice of Allowance dated Sep. 6, 2013; for U.S. Appl. No. 12/183,367; 7 pages.
Notice of Allowance dated Feb. 12, 2014; for U.S. Appl. No. 13/526,106; 25 pages.
Response to Office Action dated Sep. 25, 2014 corresponding to U.S. Appl. No. 14/093,815; Response filed on Nov. 13, 2014; 7 Pages.
Office Action dated Sep. 25, 2014 corresponding to U.S. Appl. No. 14/093,815; 15 Pages.
Office Action dated Sep. 25, 2014 corresponding to U.S. Appl. No. 14/093,787; 14 Pages.
European Office Action dated Oct. 2, 2014; for European Patent Appl. No. 09 789 890.2; 5 pages.
Notice of Allowance dated Dec. 5, 2014 corresponding to U.S. Appl. No. 14/093,815; 9 Pages.
PCT International Preliminary Report on Patentability and Written Opinion dated Dec. 31, 2014; for PCT Pat. App. No. PCT/US2013/044025; 10 pages.
Response dated Feb. 9, 2015; for European Pat. App. No. 12809923.1; 20 pages.
Notice to Submit a Response dated Apr. 20, 2015; for Korean Pat. App. No. 10-2011-7002041; 10 pages.
Email from 21st Century Patent and Law Firm dated Apr. 21, 2015; for Korean Pat. App. No. 10-2011-7002041; 2 pages.
European Response filed Jun. 29, 2015; for European Pat. Appl. No. 13729203.3; 40 pages.
PCT International Preliminary Report dated Aug. 9, 2018 for International Application No. PCT/US2017/012241; 17 Pages.
U.S. Appl. No. 15/596,514, filed May 16, 2017, Burdette et al.
Response filed on Mar. 4, 2019 for European Application No. 17702179.7; 20 Pages.
Communication pursuant to Rules 161(1) and 162 EPC dated Sep. 5, 2018 for Application No. 17702179.7; 3 Pages.
Written Submissions Submitted Further to the Official Hearing on Jul. 23, 2019 for India Application No. 186/KOLNP/2011; Written Submissions filed Aug. 6, 2019; 30 pages.

\* cited by examiner

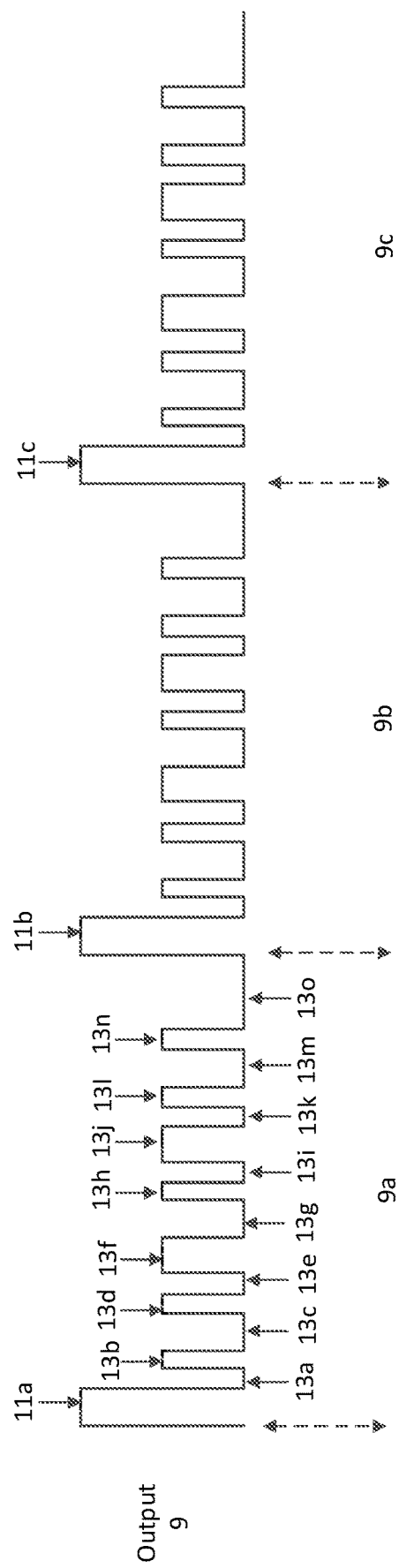

METHOD AND SYSTEM FOR PROVIDING INFORMATION ABOUT A TARGET OBJECT IN A FORMATTED OUTPUT SIGNAL

FIELD

Subject matter disclosed herein relates generally to sensors and, more particularly, to techniques, circuits, and systems for providing information regarding a sensor, a target object and/or an environment in which a sensor is disposed.

BACKGROUND

As is known in the art, sensors can be used in various types of devices to measure and monitor properties of systems in a wide variety of different applications. For example, sensors have become common in products that rely on electronics in their operation, such as automobile control systems. Common examples of automotive applications are the detection of ignition timing from an engine crankshaft and/or camshaft, and the detection of wheel speed for anti-lock braking systems and four-wheel steering systems.

As is also known, sensors can use serial communication to send data in the form of a stream of pulses or bits over a communication channel or to a computer or other processing system. Typically, each pulse stream conveys a limited amount of data.

SUMMARY

The present disclosure is directed toward concepts, methods and systems for providing a signal pulse stream which conveys information about a target object (or more simply a "target") and/or a sensor in a formatted output signal. A signal pulse stream provided in accordance with the concepts, methods and systems described herein is capable of conveying a range of information which larger than that which may be conveyed using prior art techniques. The formatted output signal uses a pulse width protocol to code information by varying widths of pulses in an output signal pulse train. In some embodiments, a pulse width protocol may code information by varying widths of pulses and/or amplitudes in an output signal pulse train.

In one aspect, the present disclosure is directed toward a method for providing a stream of pulses and providing information about a target based upon pulse widths. The method includes detecting a feature of the target and in response to detecting the feature, generating an output signal pulse train portion comprising two or more pulses with at least two of the pulses having different amplitudes and each of the two or more pulses having a width corresponding to a logic value.

With this particular arrangement, a coding protocol is provided through which a sensor's state or serial digital data may be conveyed by changing widths of pulses in a stream of pulses (also referred to herein as a "pulse train"). Each pulse can have multiple edge-to-edge widths which may represent a device state and/or a data bit in a data word. Such information can be coded for applications in different modes, including, but not limited to, a testing mode as well as a mission mode. In addition to changing pulse widths, the pulses included in a pulse train may be provided having possibly different amplitudes (i.e., high and low pulses).

In an embodiment, each output signal pulse train portion may include at least one pulse having a low amplitude and at least one pulse having a high amplitude. The method further includes measuring widths of the two or more pulses in the output signal pulse train portion in response to at least one of the two or more pulses reaching a first amplitude threshold. In some embodiments, a logic value is determined for each of the measured widths. The logic values may be used to determine at least one of a device state or a data word. The output signal pulse train portion may include N pulses and correspond to a data word which is a base N data word. In one embodiment, the output signal pulse train portion includes 3 pulses and the data word is a base 3 data word. The device state may correspond to a state of the target or a state of a sensor monitoring the target.

In some embodiments, at least two of the pulses have different widths corresponding to different logic values. For example, the output signal pulse train portion may include three pulses with a first pulse having a first width corresponding to a first logic value, a second pulse having a second width corresponding to a second logic value, and a third pulse having a third width corresponding to a third logic value. It should, of course, be appreciated that in other embodiments, fewer or greater than three pulse widths and three logic values may be used.

The output signal pulse train portion may be used to determine airgap properties between the target and a sensor monitoring the target based on the measured widths of the two or more pulses.

In an embodiment, the method includes, in response to detecting the feature, detecting a second feature after a predetermined time threshold and generating a time out function responsive to exceeding the predetermined time threshold. The time function may instruct a receiver to ignore the first feature and wait for a third feature detection.

In some embodiments, the method includes generating a first pulse in the output signal pulse train portion is responsive to the detected first feature. In the case of a gear-tooth sensor application, the first feature may be a first or leading edge of the target and the first pulse with predetermined characteristics to identify the leading edge. The first pulse may be identified based on the first pulse having an amplitude greater than or equal to an amplitude threshold.

In another aspect, the present disclosure is directed to a system for determining a state based on pulse widths. The system includes a sensor to detect a first feature of a target and in response to the detected first feature, generate an output signal pulse train portion comprising two or more pulses with at least two of the pulses having different amplitudes and each of the two or more pulses having a width corresponding to a logic value. The system further includes a receiver coupled to the sensor to receive the output signal pulse train via a signal path.

In an embodiment, the sensor comprises a magnetic field sensor. The magnetic field sensor may comprise a single-chip Hall effect sensor integrated circuit. In some embodiments, the magnetic field sensor comprises one or more Hall effect elements. In one embodiment, the magnetic field sensor comprises three Hall effect elements. Each of the Hall effect elements may be positioned along edges or at vertices of an equilateral triangle within the sensor. The three Hall effect elements can be configured to detect a magnetic profile of the target object simultaneously but at different locations within the sensor.

In some embodiments, the sensor comprises one or more detection circuits coupled to the magnetic field sensor. The one or more detection circuits may be configured to detect at least one of (a) a parameter of an environment in which the sensor is disposed, (b) the first feature of the target object, and (c) a parameter of a relationship between the sensor and the target object. In some embodiments, the one or more detection circuits are configured to a direction of the target object relative to the sensor. In other embodiments, the one or more detection circuits are configured to detect airgap properties between the target object and the sensor.

In an embodiment, the sensor is configured to generate a first pulse in the output signal pulse train portion responsive to the detected first feature. The first feature may be a leading edge of the target and the first pulse with predetermined characteristics to identify the leading edge. The receiver can be configured to identify the first pulse based on the first pulse having an amplitude greater than or equal to an amplitude threshold.

In another aspect, the present disclosure is directed towards a method of providing information. The method comprises detecting a change in a condition experienced by the sensor (e.g., a change in a characteristic of an environmental in which the sensor is disposed) and generating a plurality of pulses in response to the detected change, with a first one of the plurality of pulses having a first amplitude and second ones of the plurality of pulses having an amplitude different from the first amplitude with each of the second ones of the plurality of pulses having one of a plurality of pulse characteristic values which represent one of a like plurality of different logic values.

In an embodiment, the plurality of pulse characteristic values correspond to one of a plurality of different pulse width values. The second ones of the plurality of pulses may have the same amplitude. In some embodiments, at least some of the pulse width values are multiples of each other.

In an embodiment, the method further comprises forming a data word using at least two pulses wherein the data word conveys a characteristic of at least one of: (a) a target; and (b) an environment in which the target is disposed. A first one of the first pulse width values may be approximately twice as long as a second one of the pulse width values. A first one of the logic values may correspond to a logic zero value and a second one of the logic values may correspond to a logic one value.

In an embodiment, the first and second pulse characteristics correspond to one of: a. a pulse width characteristic; b. a pulse current level characteristic; and c. a pulse voltage level characteristic. The data word may convey a direction of rotation of a target.

In some embodiments, the sensor corresponds to at least one of a pressure sensor, temperature sensor, bolometer or infrared sensor. In other embodiments, the sensor corresponds to an accelerometer, gyroscope or gas sensor.

In some embodiments, the detected change is a change in a magnetic field. In embodiments, the detected condition or characteristic includes at least one of: a change in temperature, a change in pressure, a change in a gas level, a change in a radiation level or a change in a change in speed.

In an embodiment, the system includes a resistive element coupled between the second input of a first comparison device and a second input of a second comparison device.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 1C is a plot of an illustrative signal pulse train having pulses provided in accordance with a pulse width protocol;

DETAILED DESCRIPTION

Figure 1:
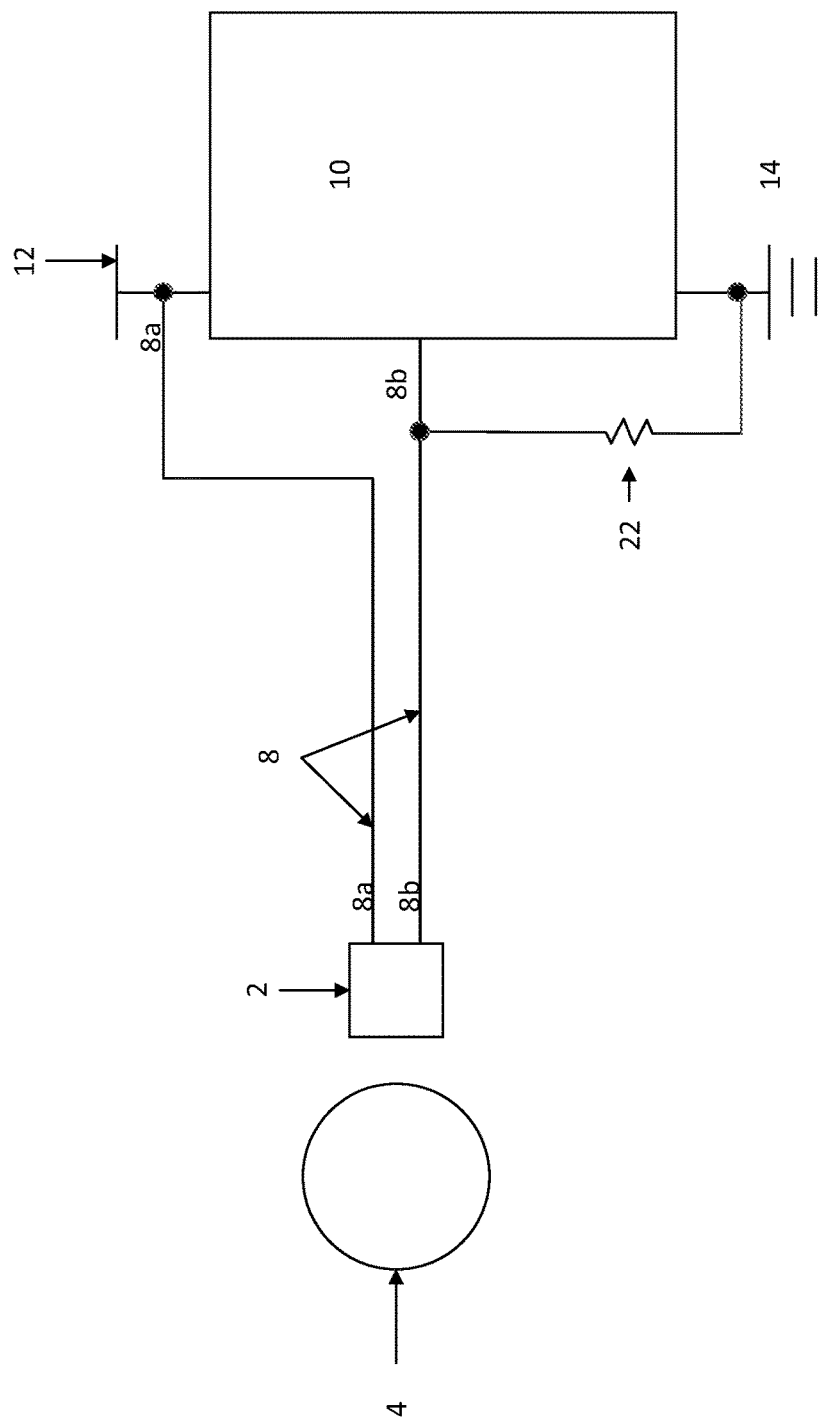
FIG. 1 is a block diagram of a system having a sensor disposed proximate to a target.

The present disclosure is generally directed toward a sensor capable of providing information about a target and/or the sensor itself using a formatted output signal pulse train as well as towards related methods and systems. The signal pulse train includes multiple pulses each of which may have one or more different characteristics including, but not limited to, different amplitudes and pulse widths. The different characteristics (e.g., position, amplitude, width) of each of the pulses may be used to provide a variety of information related to the target and/or the sensor itself.

The output signal pulse train includes pulses in which the pulse widths may represent either device state information or data bits used to form data words. In some cases, widths and/or amplitudes of consecutive pulses within a pulse train are used to provide state information or to form data words. Thus, a single device or application may use the pulse train information for either device state or data words within different modes. For example, during a first operating mode a device or application may use device state information. In a second operating mode (e.g. a test mode), however, the device or application may use data words. The first operating mode may refer to operation of a device during its intended (or normal) operation or "mission" (and thus is sometimes referred to "mission mode"). Test mode may refer to a time period during which various components of a device are tested.

In an embodiment, the pulse train includes delimiting pulses such that a series of pulses between the delimiting pulses may be considered together to convey information (e.g. device state information or data bits used to form data words). In some cases, a delimiting pulse followed by a series of pulses occurring before a next delimiting pulse may be considered together to convey information (i.e. the first delimiting pulse and the following series of pulses are considered together to convey information). The delimiting pulses define portions of a pulse train. Thus, the pulse train may be considered as having a plurality of pulse train portions comprised of a first (or delimiting) pulse followed by one or more second (or non-delimiting) pulses. The first pulse in each pulse train portion is generated in response to detection by the sensor of some feature of a target. For example, in the case of a speed and direction sensor in an automotive application, a sensor may provide a first (or delimiter) pulse in response to detection of each edge of a plurality of teeth on an exciter wheel. In an embodiment, the sensor may generate pulses in response to either a rising edge, falling edge, or, in the case of double data rate, both rising and falling edges of the exciter wheel target or in response to a magnetic differential signal.

In an embodiment, delimiting pulses may be distinguished from non-delimiting pulses by some pulse characteristic (e.g. a pulse amplitude or a pulse width characteristic). For example, delimiting pulses may be provided having an amplitude which differs from the amplitude of non-delimiting pulses.

The pulse train, or each portion thereof, may represent a device state or a data word having a base number based upon a potential number of pulse widths (e.g., a base three (3) system would have three (3) potential pulse widths and more generally a base N system would have N potential widths).

Further aspects and details of the disclosure will now be more particularly described. It will be understood that particular embodiments described herein are shown by way of illustration and not as limitations of the concepts, systems and techniques described herein. The principal features of this disclosure can be employed in various embodiments without departing from the scope of the disclosure.

Now referring to FIG. 1, a sensor 2 is disposed proximate a target object 4 (or more simply, a "target"). Sensor 2 may be provided, for example, as a magnetic field sensor. In response to movement of target 4, sensor 2 may generate a series of pulses, referred to herein as a pulse train, the characteristics and benefits of which will be described herein below. Sensor 2 may be the same as or similar to the types described in each of U.S. Pat. No. 6,815,944, filed on Oct. 29, 2002, U.S. Pat. No. 7,026,808, filed on Sep. 23, 2004, U.S. Pat. No. 8,624,588, filed on Jul. 31, 2008, U.S. Pat. No. 9,151,771, filed on Dec. 2, 2013, U.S. Pat. No. 8,994,369, filed on Dec. 2, 2013, and U.S. Pat. No. 8,754,640, filed on Jun. 18, 2012, all of which are incorporated herein by reference in their entireties.

Signal paths 8a, 8b (collectively referred to herein as signal path 8) couple sensor 2 to a receiver 10. In some embodiments, signal paths 8a, 8b couple a supply voltage 12 and a reference point (i.e., ground) 14 to sensor 2 as will be discussed in greater detail below. In the illustrative embodiment of FIG. 1, signal path 8 is shown provided as a two wire line 8a, 8b although any signal path or transmission line suitable for transmission of a pulse train from sensor 2 to receiver 10 may be used. The output signal pulse train generated by sensor 2 is appropriate for use in two-wire, three-wire or n+1 wire sensor solutions.

Sensor 2 is disposed within a predetermined distance from target 4 to detect characteristics and features of target 4, such as speed and direction information. The particular positioning of sensor 2 with respect to target 4 will, of course, depend upon the needs of the particular application or system in which the sensor 2 is being used.

It should be appreciated that sensor 2 may be adapted (and in some cases, optimized) for use in a wide variety of different applications including, but not limited to, accelerometer applications, gyroscope applications, gas sensor applications, pressure sensor applications, temperature sensor applications, bolometer sensor applications, infrared sensor applications and automotive applications.

Figure 1A:
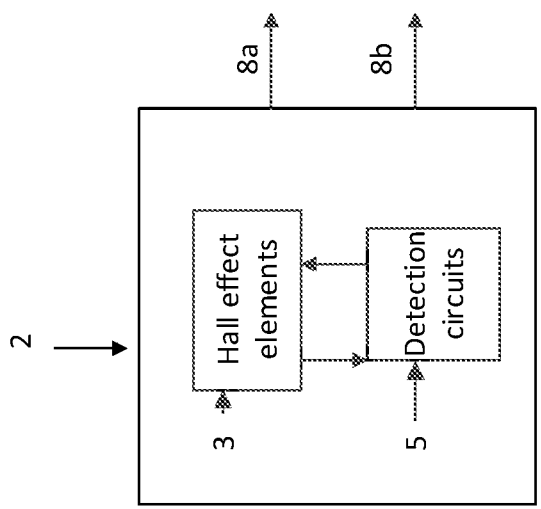
FIG. 1A is a block diagram of a system having a sensor disposed to sense a properties of an environment around the sensor.
Figure 1A:
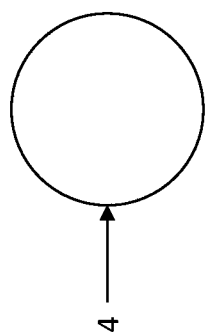

Referring briefly to FIG. 1A, sensor 2 may sense different properties and characteristics of the environment 7 around sensor 2. In an embodiment, sensor 2 is configured to detect a direction value, pressure value, temperature value, acceleration value, movement value, rotation value, etc. In other embodiments, sensor 2 is configured to detect a magnetic field variation in environment 7. The magnetic field variation may be used to detect a wide variety of different properties and characteristics of the environment 7 around sensor 2. For example, the magnetic field variation may be used to detect a direction value, rotation value, angle value, speed value, etc.

Referring back to FIG. 1, in one embodiment, sensor 2 can be positioned at varying distances and oriented at various angles relative to target 4 based upon the needs of a particular application. In some embodiments, sensor 2 can be mounted at any angle in a plane perpendicular to a rotation of target 4. Sensor 2 may be positioned such that a plane of least one surface of sensor 2 is parallel with a surface or edge of target 4.

Figure 1B:
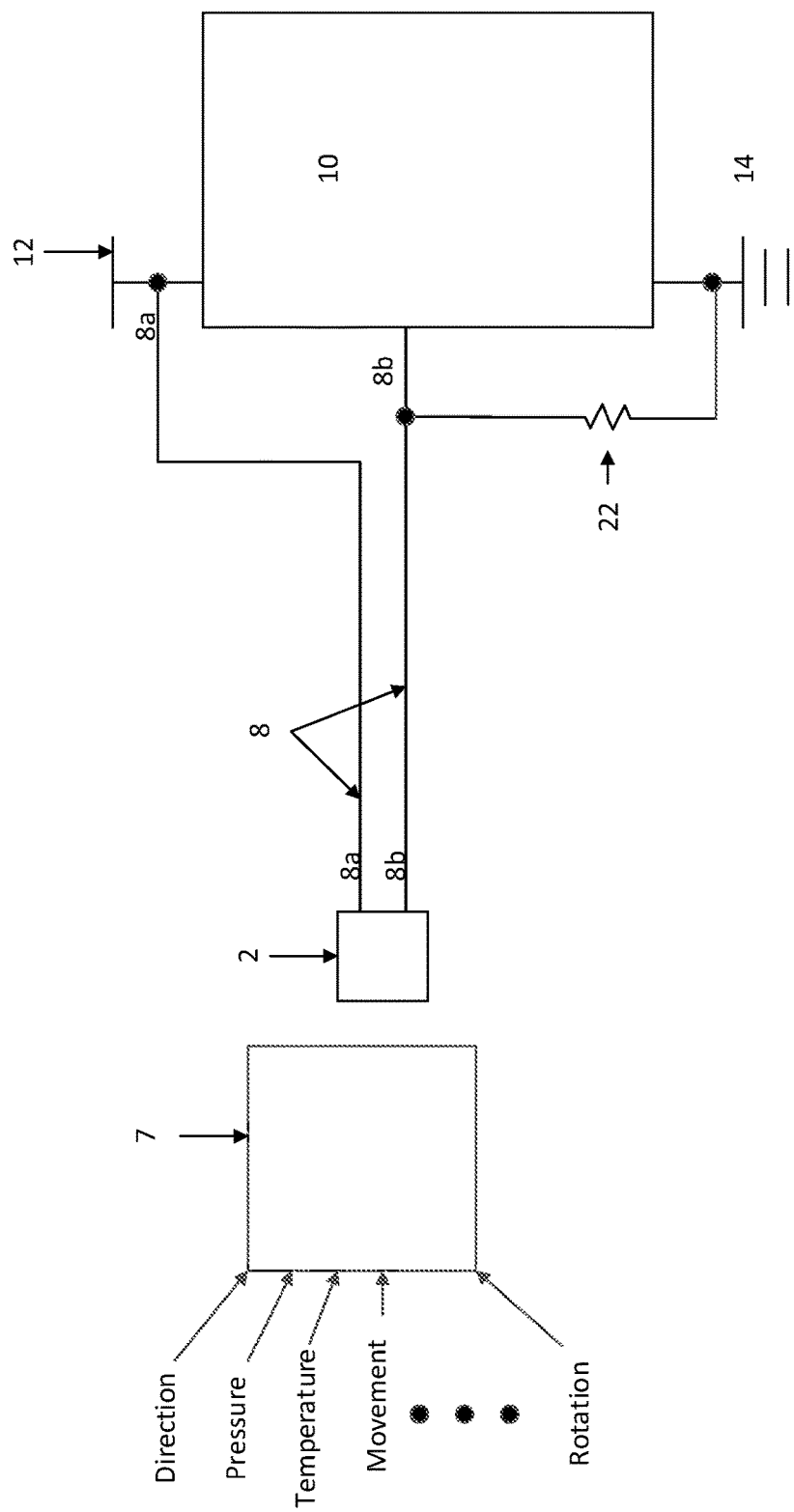
FIG. 1B is a block diagram of a sensor to generate a signal pulse train having pulses provided in accordance with a pulse width protocol.

Sensor 2 is configured to generate an output signal pulse train in response to detecting characteristics and mechanical features (or more simply "features") of target 4. Referring briefly to FIG. 1B, in an embodiment, sensor 2 may be a magnetic field sensor integrated circuit (IC). For example, sensor 2 may be a single-chip Hall-effect sensor IC. The Hall-effect sensor may have one or more Hall elements 3. In one embodiment, with three Hall elements 3, the Hall elements 3 may be positioned along edges or at vertices of an equilateral triangle within sensor 2. In such an embodiment, each of the Hall elements 3 sense the magnetic profile of target 4 simultaneously but at different locations.

In some embodiments, sensor 2 includes one or more detection circuits 5 coupled to Hall effect elements 3. The one or more detection circuits 5 can be configured to detect at least one of (a) a parameter of an environment in which the sensor is disposed, (b) the first feature of the target object, and (c) a parameter of a relationship between the sensor and the target object. For example, the one or more detection circuits 5 can be configured to detect a direction of the target object 4 relative to sensor 2 and airgap properties between target object 4 and sensor 2. In some embodiments, the one or more detection circuits can be configured to detect a magnetic field variation in the environment in which sensor 2 is disposed.

Sensor 2 may be used to communicate information for a variety of different sensors. In some embodiments, sensor 2 may be adapted for used in an accelerometer, a gyrometer, a gas sensor, a pressure sensor, or a temperature sensor. Sensor 2 may detect a condition of an environment in which the sensor is disposed (e.g. a condition experienced by sensor 2) and generate the output signal pulse train to provide information corresponding to this condition. For example, in some embodiments, the detected condition is a change in a magnetic field. In other embodiments, the detected condition includes at least one of: a change in temperature, a change in pressure, a change in a gas level, a change in a radiation level or a change in a change in speed. The output signal pulse train may be initiated by a change in the condition that falls below or above a predetermined threshold or outside a predetermined acceptable range of values. For example, a temperature experienced by sensor 2 may fall below or above a predetermined threshold or a pressure experienced by sensor 2 may fall below or above a predetermined threshold. In response, sensor 2 may generate the output signal pulse train to indicate this change in condition. In some embodiments, sensor 2 may generate the output signal pulse train as part of a built-in test (BIT) or in response to a test probe applied to a particular device.

Referring back to FIG. 1, in the illustrative embodiment, signal paths 8a, 8b couple sensor 2 to receiver 10, supply voltage 12 and reference point (i.e., ground) 14. In an embodiment, a first signal path 8a is coupled to supply voltage 12 and receiver 10 and a second signal path 8b is coupled to receiver 10 and to reference point 14 through a resistor 22.

The output signal pulse train generated by sensor 2 propagates to receiver 10 via one or both of signal paths 8a, 8b. Thus, in some embodiments, the output signal pulse train propagates to receiver 10 via signal path 8b while in other embodiments, the output signal pulse train propagates to receiver 10 via signal path 8a.

Receiver 10 receives the pulse train provided thereto and in response thereto determines device state information and/or data bit values (or word values). In one embodiment, receiver 10 identifies a first (or delimiter) pulse in the pulse train by detecting a particular pulse characteristic (e.g., pulse amplitude or pulse width or some other pulse characteristic) and then begins measuring pulse widths of the following (non-delimiter) pulses. As will be described in detail further below, the widths of both high and low pulses are used to convey information via the pulse train.

Referring briefly to FIG. 1C, an output signal pulse train 9 includes a plurality of pulse train portions, here three (3) pulse train portions, 9a-9c. The beginning of each pulse train portion 9a-9c is identified by first (or delimiter) pulses 11a-11c. First (or delimiter) pulse in the output signal pulse train may be identified by a pulse characteristic which differs from a like characteristic of every other non-delimiter pulse in the output signal pulse train. In the illustrative embodiment of FIG. 1C, for example, an amplitude characteristic is used. In particular, first pulses 11a-11c in the output signal pulse train portions 9a-9c are provided having an amplitude which differs from the amplitude of the remaining non-delimiter pulses (e.g. pulses 13a-13o in the pulse train portion 9a, for example). It should, of course, be appreciated that although first (or delimiter) pulses are here shown having an amplitude which is greater than an amplitude of all other pulses in the pulse train (or greater than a predetermined amplitude threshold value) in other embodiments, it may be desirable or necessary that first (or delimiter) pulses are provided having an amplitude which is less than an amplitude of all other pulses in the pulse train (or less than an amplitude threshold value).

In another illustrative embodiment, a pulse width characteristic (rather than an amplitude characteristic) may be used to identify the first (or delimiter) pulse. For example, each first (or delimiter) pulse in the output signal pulse train may be identified by having a pulse width which differs from the pulse width of the non-delimiter pulses in the pulse train. For example, the delimiter (or first) pulse may be provided having a pulse width which is either less than or greater than a width of all other non-delimiter pulses in the pulse train or greater or less than a predetermined pulse width threshold value.

The output signal pulse train may include data associated with detected characteristics and/or features of target 4 or with characteristics and/or features associated with the sensor itself. As noted above, it should be appreciated that the data may be transmitted in different forms, including as a current signal, a voltage signal value, an RF signal characteristic value (e.g. a current voltage, frequency, or phase characteristic), etc.

Figure 2:
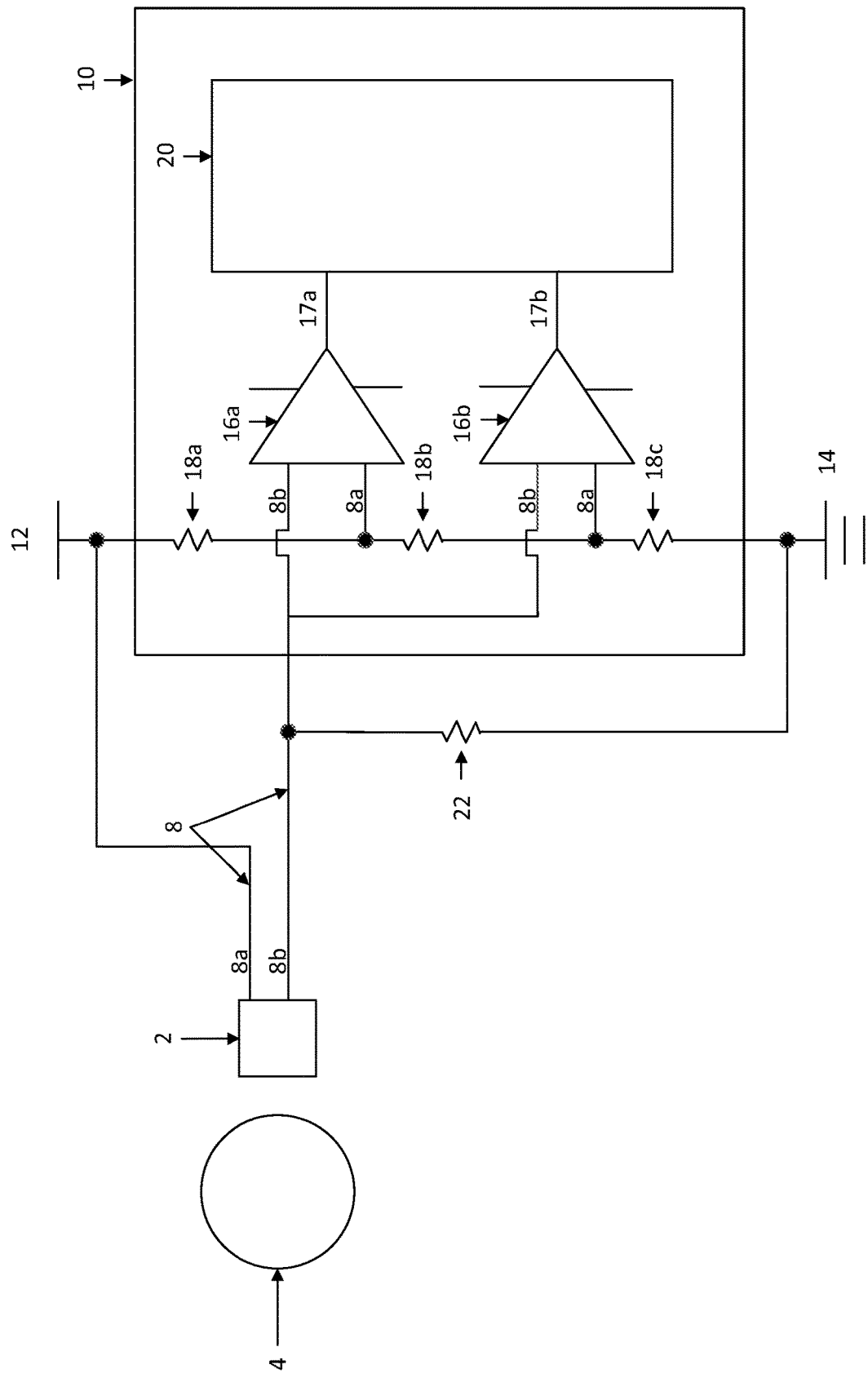
FIG. 2 is a circuit diagram of a system having a sensor and circuitry to detect a pulse stream provided by the sensor.

Now referring to FIG. 2, a system illustrates the coupling between sensor 2 and components of an illustrative receiver 10. Receiver 10 includes a pair of comparison devices (e.g. comparators) 16a, 16b and a processor 20 (e.g., state machine, digital block, controller, etc.). Comparison devices 16a, 16b have two inputs that are coupled to sensor 2 through signal paths 8. An output 17a, 17b of each comparison device 16a, 16b is coupled to processor 20.

In one illustrative embodiment, first signal path 8a couples supply voltage 12 to a first input of first comparison device 16a and second comparison device 16b. While a pulse width pulse train such as that described in FIG. 1C is provided to receiver 10 via signal path 8b. Supply voltage 12 may provide a reference voltage to first and second comparison devices 16a, 16b. To generate the reference voltage, resistive elements 18a, 18b, 18c are disposed along the first signal path 8a between supply voltage 12 and a first input of each of first and second comparison devices 16a, 16b. In an embodiment, each resistive element 18a, 18b, 18c provides a voltage drop to generate and provide a predetermined reference voltage to first and second comparison devices 16a, 16b.

For example, and as illustrated in FIG. 2, a first resistor 18a is disposed between supply voltage 12 and first input of first comparison device 16a. A second resistor 18b is disposed between the first input of first comparison device 16a and the first input of second comparison device 16b. A third resistor 18c is disposed between the first input of second comparison device 16b and a reference point 14. Resistive elements 18a, 18b, 18c may be sized to various values according to a particular application and the properties of the components in a corresponding sensor system.

In an embodiment, first and second comparison devices 16a, 16b compare the predetermined reference voltage to data output (i.e., an output signal pulse train) generated by sensor 2. The data output may be transmitted in different forms, including as a current value, a voltage value or a RF signal. In an embodiment, second signal path 8b provides data output (e.g., characteristics and features associated with target 4 and/or characteristics and features associated with sensor 2) from sensor 2 to first and second comparison devices 16a, 16b. As shown in FIG. 2, second signal path 8b couples sensor 2 to a second input of each of first and second comparison devices 16a, 16b. In other embodiments, first signal path 8a provides data output from sensor 2 to first and second comparison devices 16a, 16b and second signal path 8b couples supply voltage 12 to first and second comparison device 16a, 16b.

In some embodiments, second signal path 8b is coupled to ground (i.e., reference point 14) through a load resistor 22. Load resistor 22 is disposed between a node of second signal path 8b and reference point 14. The node of second signal path 8b is disposed between the output of sensor 2 and the second input of first and second comparison devices 16a, 16b. Load resistor 22 may be used to modify or set an output value of sensor 2 that is provided to the second input of first and second comparison devices 16a, 16b to a predetermined level. For example, in some embodiments, load resistor 22 provides a voltage drop corresponding to a product of an output of sensor 2 and a value of resistor 22. Load resistor 22 may be sized to various values according to a particular application and the properties of the components in a corresponding sensor system.

In FIG. 2, comparison devices 16a, 16b are arranged to form a window comparator. However, it should be appreciated that comparators may be organized in other arrangements depending upon a particular application. First and second comparison devices 16a, 16b compares two inputs (e.g., two voltages, two current, two radio frequency (RF) signals) and output a digital signal. Outputs of first and second comparison devices 16a, 16b are coupled to processor 20. Processor 20 can be configured to compare the output 17a of first comparison device 16a to the output 17b of second comparison device 16b.

Processor 20 may be a logic or state machine and be configured to receive outputs 17a, 17b and determine device state information and/or data bits. For example, processor 20 is configured to determine a logic value for each of the measured widths. Processor 20 may be any computing device suitable for the execution of a computer program include, by way of example, both general and special purpose microprocessors, and any one or more processors of any kind of digital computer. Generally, processor 20 can also include, or be operatively coupled to receive data from or transfer data to, or both, one or more memory systems or mass storage devices for storing data, e.g., magnetic, magneto optical disks, or optical disks. Processor 20 and the memory can be supplemented by, or incorporated in, special purpose logic circuitry.

To determine the device state information and/or data bits, processor 20 can be configured to measure widths and amplitudes of each pulse in an output signal pulse train. Processor 20 may identify a particular pulse in a pulse train portion (e.g., a first pulse, a second pulse, a third pulse, etc.) based upon the pulse having an amplitude greater than or equal to an amplitude threshold. The amplitude threshold may be a threshold value, amplitude, level or height used to identify the particular pulse in the output signal pulse train portion. In some embodiments, the receiver begins measuring the pulses widths in response to a detected first feature of target 4 reaching a first amplitude threshold. The first feature may be identified via one or more predetermined characteristics of a target (e.g., a leading edge of a tooth or an exciter wheel). Processor 20 is configured to determine the logic value for each of the measured widths and determine at least one of a device state or a data word based on the determined logic values of the two or more pulses. In some embodiments, processor 20 is configured to generate time out functions in response to delays in sensor 2 detecting a second feature or subsequent feature of target 4 after a predetermined time threshold.

Now referring to FIG. 3, a portion of an illustrative output signal pulse train 50 (hereinafter "output"), comprising a plurality of portions 51a, 51b, 51c comprising respective ones of pulses 52a-52c, 54a-54c, 56a-56c provided in accordance with a predetermined protocol is generated in response to a sensor (not shown) detecting one or more characteristics and/or one or more features (e.g., one or more mechanical features) of a target 30. Pulses 52a-52c may be collectively referred to herein as pulse 52 or first pulse 52. Pulses 54a-54c may be collectively referred to herein as pulse 54 or second pulse 54. Pulses 56a-56c may be collectively referred to herein as pulse 56 or third pulse 56.

Figure 3:
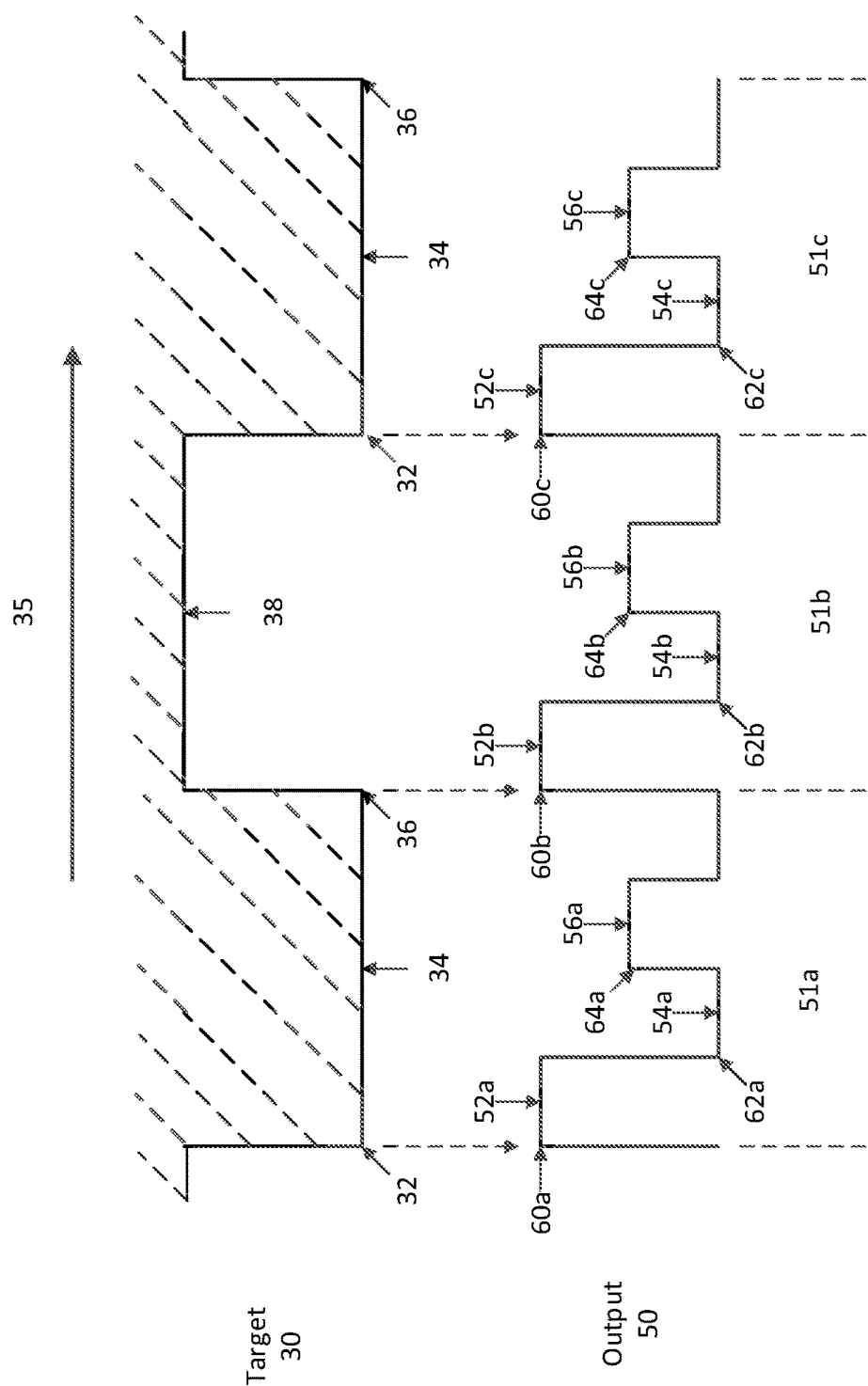
FIG. 3 is a timing diagram showing the sensor output for an object moving in a first direction.

In the illustrative example of FIG. 3, target 30 is shown as a portion of a gear tooth wheel. In an embodiment, output 50 is generated in response to target 30 moving in a first direction (indicated by reference arrow 35) relative to the sensor. For ease of reference, direction 35 is sometimes referred to as a right movement or right rotation of the target 30 relative to the sensor.

Briefly referring to FIGS. 1-2, sensor 2 may generate output 50 in response to detecting characteristics and features of target 30. It should be appreciated that output 50 may be generated in response to target 30 moving in any direction relative to the sensor (i.e., left, right, toward or away from the sensor).

In the illustrative gear tooth sensor example of FIG. 3, target 30 has a plurality of teeth 34, each of which has a first edge 32 and a second edge 36. In an embodiment, when teeth 34 of target 30 pass by a sensor (e.g., sensor 2 of FIGS. 1-2), the sensor generates output 50. In other embodiments, target 30 may be a ring magnet and when a pole pair of the ring magnet passes by the sensor, the sensor generates output 50. In still other embodiments, such as when target 30 is a magnetic latch or switch, when an edge of the magnetic latch passes by the sensor, the sensor generates output 50. It should be understood that target 30 may be a variety of different devices and the sensor may generate output 50 in response to various features of target 30.

Output 50 comprises a plurality of pulse train portions 51a, 51b, 51c, (collectively referred to herein as portions 51) with each portion 51 including respective ones of the plurality of pulses 52, 54, 56 (i.e., first pulse 52, second pulse, 54, third pulse 56). Each pulse 52, 54, 56 is generated in accordance with a pulse width protocol which allows coding of information about the target 30 and/or sensor, including but not limited to speed, direction, positional data, diagnostic data, airgap data, device status and test mode information.

Each of the plurality of pulses 52, 54, 56 within a single portion 51 (e.g., pulses 52a, 54a, 56a within first pulse portion 51a) can have varying amplitudes and varying widths. The amplitude and width of a pulse, as well as the position (e.g., first pulses 52, second pulses 54, third pulses 56) may be used to code the information and indicate specific characteristics and/or features of a target 30 and/or a sensor generating the pulse train. For example, first pulses 52 may be used to convey different information than second pulses 54 or third pulses 56. Likewise, second pulses 54 and third pulses 56 may be used to convey different information from each other and first pulses 52.

In an embodiment, each of the pulses 52, 54, 56 may be generated with a predetermined amplitude to indicate specific characteristics and/or features of or associated with a target and/or sensor. It should be understood that amplitude as used herein may refer to a level or height of pulses 52, 54, 56 in output 50. Pulse amplitude may also be used to identify a position of the pulse in the output signal pulse train (e.g., first pulses 52, second pulses 54, third pulses 56). For example, first pulse 52 may be generated in response to a first feature (e.g., an edge 32, 36,) of target 30). To indicate that this is the first feature of target 30, the first pulse 52 is generated with a first amplitude 60 (e.g., first level, high level) that is equal to or greater than a first amplitude threshold. In some embodiments, the first amplitude threshold is a threshold value, level or height that is used to indicate that pulse 52 is the first pulse in output signal pulse train portions 51a, 51b, 51c. In the illustrative embodiment of FIG. 3, first pulse 52 in each portion 51a, 51b, 51c corresponds to either a rising edge 32 or falling edge 36 of a tooth 34. Thus, first pulse 52 having the first amplitude 60 indicates the beginning of a new portion 51 of output signal pulse train 50.

In some embodiments, the rising edge of first pulse 52 represents additional data such as target speed or frequency. For example, the time between first pulse 52a of first portion 51a and first pulse 52b of second portion 51b may be used to determine the speed or frequency at which the target 30 is moving or rotating.

A second pulse 54 may be generated in response to a second feature or other characteristics of target 30. In some embodiments, second pulse 54 is generated having a second amplitude 62 (e.g., second level, low level) that is greater than or equal to a second amplitude threshold. In some embodiments, the second amplitude threshold is a threshold value, level or height that is used to indicate that pulse 54 is the second pulse in output signal pulse train portions 51*a*, 51*b*, 51*c*. The second amplitude 62 may be inverted (e.g., low pulse, low amplitude) with respect to first amplitude 60. In the illustrative embodiment of FIG. 3, second pulse 54 follows first pulse 52 and its amplitude 62 falls to a reduced (or sometimes minimum) amplitude of output 50. In some embodiments, second pulse 54 is inverted as compared with first pulse 52. It should thus be understood that the widths of both high and low portions of output pulse train 50 are used to convey information in the pulse width protocol.

Similarly, third pulse 56 may be generated in response to a third feature or characteristic of target 30. In some embodiments, third pulse 56 is generated with a third amplitude 64 (e.g., third level, middle level) that is greater than or equal to a third amplitude threshold (i.e., middle amplitude). In some embodiments, the third amplitude threshold is a threshold value, level or height that is used to indicate that pulse 56 is the third pulse in output signal pulse train portions 51*a*, 51*b*, 51*c*. The third amplitude 64 may be less than first amplitude 60 and inverted with respect to second amplitude 62. In the illustrative embodiment of FIG. 3, third pulse 56 follows second pulse 54 and its amplitude rises to a third amplitude 64, which is less than the first amplitude 60 of first pulse 52.

Although FIG. 3 only shows each portion 51 of output 50 having three pulses 52, 54, 56, it should be appreciated that any number of pulses may be generated within a portion 51 of output 50 depending upon a movement or other characteristic of a target and the needs of a particular application. For example, output 50 may include N pulses or N bits in response to a detected feature of target 30.

Figure 4:
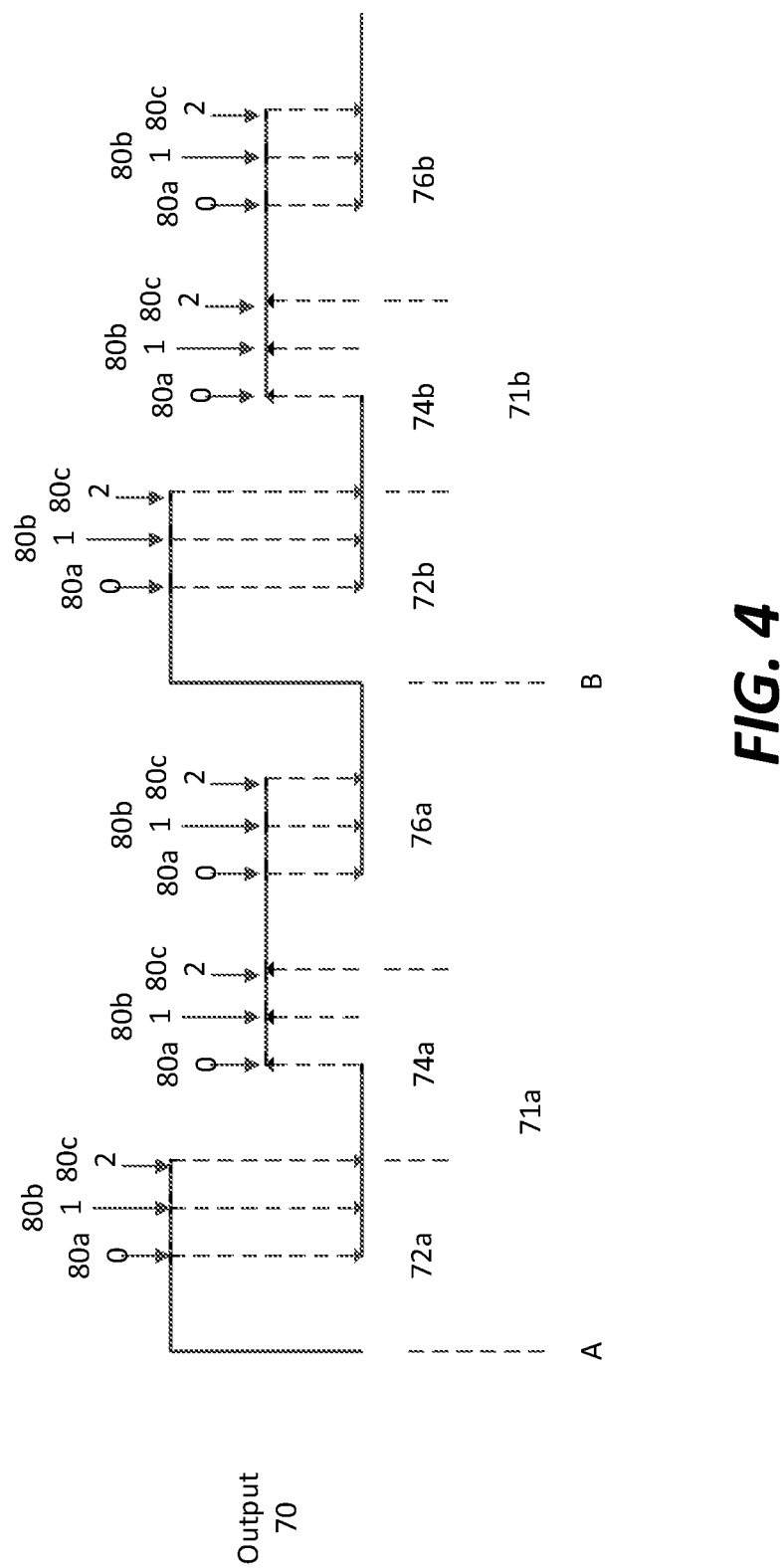
FIG. 4 is a timing diagram showing the sensor output pulse train having varying widths.

Now referring to FIG. 4, a portion of an output pulse train 70 includes pulse train portion 71*a*, 71*b*. Each of the first pulses 72*a*-72*b*, second pulses 74*a*-74*b*, third pulses 76*a*-76*b* (collectively referred to herein as pulses 72, 74, 76) in first and second pulse train portions 71*a*, 71*b* may be generated having a selected one of pulse widths 80*a*-80*c*. The particular width of each pulse corresponds to a particular bit value which may be used to indicate a specific feature of a target and/a sensor or may be used to form a portion of a digital word. The width 80*a*-80*c* of each pulse may thus be used to provide information such as direction information, airgap properties, a sensor mode, a sensor position and diagnostics data (e.g., automobile safety integrity level (ASIL) information).

In an embodiment, each pulse 72, 74, 76 may have up to N different widths. In the illustrative embodiment of FIG. 4, each pulse 72, 74, 76 can have one of three different widths, including a first width 80*a*, a second width 80*b* and a third width 80*c*. In some embodiments, the widths of pulses 72, 74, 76 may be the same. In other embodiments, the widths of each pulse 72, 74, 76 may be different. In still other embodiments, the widths of two or more pulses 72, 74, 76 may be the same.

In an embodiment, the position of each pulse is first determined (e.g. relative to the delimiter pulse, here corresponding to first pulse 72 followed by second pulse 74 and third pulse 76) and then the width 80 of the pulse is determined. For example, after the first feature of the target is detected and pulse 72 is identified as the first pulse, a width 80 (e.g., first width 80*a*, second width 80*b*, third width 80*c*) of first pulse 72 and each successive pulse 74, 76 may be measured. The width 80 can be used in combination with the position of the particular pulse to provide specific information. For example, first pulse 72 and second pulse 74 may have the same width 80 but provide different information.

Referring to Table 1 below, an illustrative base three (3) pulse width protocol is shown to provide state information.

TABLE 1

| Pulse Width Protocol (base 3) States | | |
| --- | --- | --- |
| State | Example | Pulse |
| 1 | +Direction | First Pulse = 0 width |
| 2 | −Direction | First Pulse = 1 width |
| 3 | No Direction | First Pulse = 2 width |
| 4 | Airgap in range | Second Pulse = 0 width |
| 5 | Airgap Flag | Second Pulse = 1 width |
| 6 | Reserve | Second Pulse = 2 width |
| 7 | Sensor Mode 0 | Third Pulse = 0 width |
| 8 | Sensor Mode 1 | Third Pulse = 1 width |
| 9 | Sensor Mode 2 | Third Pulse = 2 width |

As shown in table 1, each pulse 72, 74, 76 may be designated or assigned to provide predetermined information, such as state information. Each state may correspond to a characteristic or feature of a target or a sensor. In some embodiments, state information may be generated and used for applications functioning in mission mode (e.g., normal mode) and provide details on particular devices during device operation. For example in Table 1, first pulse 72 is designated to provide direction information of a target, second pulse 74 is designated to provide airgap information between the target and a sensor and third pulse 76 is designated to provide sensor mode information.

In the illustrative embodiment of FIG. 4, each pulse 72, 74, 76 is shown having one of three widths 80*a*, 80*b*, 80*c*. Thus, since output pulse train portions 71*a*, 71*b* each have three pulses (i.e. pulses 72*a*, 74*a*, 76*a*, 72*b*, 74*b*, 76*b*, respectively) with each of the pulses 72*a*, 74*a*, 76*a*, 72*b*, 74*b*, 76*b*, having one of three possible widths 80*a*, 80*b*, 80*c* each output pulse train portion 71*a*, 71*b* can provide up to nine different states or types of information.

For example, first pulse 72 may be generated in response to a first feature (e.g., first rising edge or first falling edge) of a target with one of three widths 80*a*, 80*b*, 80*c* (here indicated by the dashed downward arrow). In this embodiment, first pulse 72 is designated to provide direction in which the target is moving. Thus, first width 80*a* indicates a positive direction, second width 80*b* indicates a negative direction and third width 80*c* indicates no direction.

Second pulse 74 can be designated to provide airgap information between a target and sensor. Thus, second pulse 74 with a first width 80*a* indicates an airgap feature in a predetermined acceptable range, a second width 80*b* indicates an airgap feature outside the predetermined acceptable range and may cause an alert or flag to be issued. Furthermore, second pulse 74 having a third pulse 80*c* may indicate an airgap reserve and an airgap reserve (AR) signal can be generated. In an embodiment, airgap reserve may refer to a reserve bit or extra bit and be reserved for a future use.

Third pulse 76 can be designated to provide sensor mode information. Thus, third pulse 76 with a first width 80*a* indicates sensor mode 0, while third pulse 76 with a second width 80*b* indicates sensor mode 1, and third pulse 76 with a third width 80*c* indicates sensor mode 2.

It should be appreciated however, that Table 1 provides but one illustrative embodiment and that any number of states and types of information can be designated according the number of pulses in output 70 and the type of information a particular device or application requests to be monitored or detected (e.g., diagnostics, ASIL, device status, etc.,).

In some embodiments, pulse widths 80a, 80b, 80c of each of the pulses 72, 74, 76 represent a corresponding & logic value, such as a logical data bit. The widths 80 of each pulse 72, 74, 76 in output 70 may be measured and the corresponding logic value determined for each pulse 72, 74, 76. For example, a first width 80a may be a first logic value, a second width 80b may be a second logic value and a third width 80c may be a third logic value in a digital data stream. Thus, output 70 can be represented as a digital data string (i.e., a stream of data bits with each of the data bits having one of three logic values). In other embodiments, a stream of data bits can be generated with each of the data bits having one of two logical values.

The widths 80 may be measured as the pulses 72, 74, 76 are received, for example as they are received by receiver 10 from sensor 2 of FIGS. 1-2. In other embodiments, the widths 80 may be measured once an entire portion 71 of output 70 has been transmitted from a sensor to a receiver.

The data bits of the data string can be grouped into data words with each word including a predetermined number of bits. Thus, portion 71 of output 70 may be a serial data train representing a data word with a base N, corresponding to N number of potential pulse widths 80 (here shown as a base 3 with 3 potential pulse widths).

Each word can be a code associated with a characteristic or feature of a target or a sensor. Referring now to Table 2 and FIG. 4, a pulse width protocol (base 3) for generating data words is provided.

TABLE 2

Pulse Width Protocol (base 3) Data Word

| Code | First Pulse | Second Pulse | Third Pulse |
|---|---|---|---|
| 0 | 0 | 0 | 0 |
| 1 | 0 | 1 | 0 |
| 2 | 0 | 2 | 0 |
| 3 | 0 | 1 | 1 |
| 4 | 0 | 1 | 2 |
| 5 | 0 | 2 | 1 |
| 6 | 0 | 2 | 2 |
| 7 | 1 | 0 | 2 |
| 8 | 1 | 1 | 0 |
| 9 | 1 | 2 | 0 |
| 10 | 1 | 1 | 1 |
| 11 | 1 | 1 | 2 |
| 12 | 1 | 2 | 1 |
| 13 | 1 | 2 | 2 |
| 14 | 2 | 0 | 0 |
| 15 | 2 | 1 | 0 |
| 16 | 2 | 2 | 0 |
| 17 | 2 | 1 | 1 |
| 18 | 2 | 1 | 2 |
| 19 | 2 | 2 | 1 |
| 20 | 2 | 2 | 2 |

As shown in Table 2, output 70 having three pulses 72, 74, 76, with each pulse having three potential pulse widths 80a, 80b, 80c can provide up to twenty different logic values (i.e., code) or data words. Each logic value may be associated with test or diagnostics information for a device or application. For example, logic values can be associated with output codes for a built-in test (BIT) or a test at a probe of a device or application. Logic values may be associated with an output 70 received from various types of sensors, including but not limited to an accelerometer, a gyroscope, a gas sensor, a pressure sensor, and a temperature sensor. In some embodiments, a receiver (e.g., receiver 10 of FIGS. 1-2) may translate or convert portion 71 of output 70 to a word in a test mode.

In an embodiment, output 70 may have a maximum frequency limit or bound depending on the number of pulses 72, 74, 76 generated in portion 71 and the maximum width 80 used for each pulse in the respective portion 71. For example, in one embodiment, the maximum frequency of a target or data stream is based on the total number of pulses in portion 71 of output signal 70 multiplied by the maximum pulse width 80. If the target or data stream exceeds this frequency there may be data collision between adjacent portions 71, such as between a first portion 71a and a second portion 71b. The maximum frequency limit establishes a threshold to avoid data collision within output 70.

In some embodiments, when a first rising edge of first pulse 72a is received and a second rising edge of a subsequent first pulse 72b is not received within a predetermined time threshold, a time out function may be generated to ignore the first rising edge of 72a. For example, when receiver 10 of FIGS. 1-2, identifies first edge of first pulse 72a it may initiate a timer with a predetermined time threshold to track or count until the next rising edge is identified in the data bits. In an embodiment, the predetermined time threshold limits the amount of time the timer counts to identify potential edge error detections. Thus, if the next rising edge is not identified within the predetermined time threshold, the receiver may flag the first rising edge as an edge error and stop the timer until a next rising edge is identified. The sensor system 2 can quickly recover from the error signal and also identify edge errors. The predetermined time threshold may allow the system not to get stuck in a continuous timer or lock up when an edge error is detected. In some embodiments, the predetermined time threshold may be used in consecutive pulse widths to identify errors within a single portion 71 of output signal 70.

Figure 5:
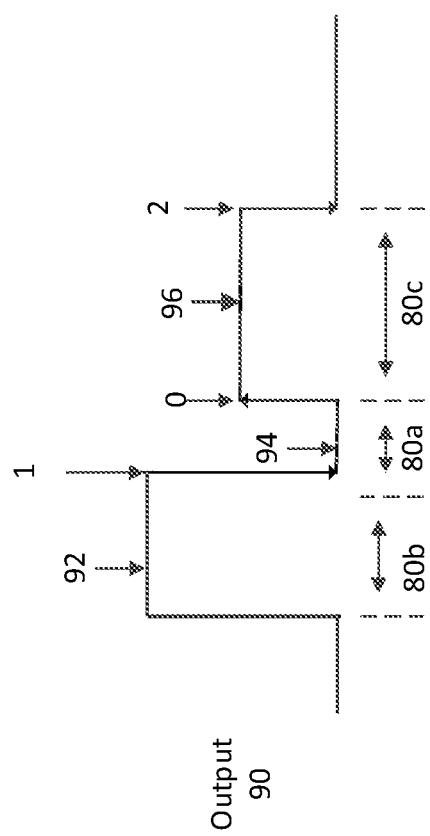
FIG. 5 is a timing diagram showing one illustrative sensor output for an object moving in the first direction.

Now referring to FIG. 5, an output pulse portion 90 includes a first pulse 92 having a width 80b corresponding to a logic value 1, a second pulse 94 having a width 80a corresponding to a logic value 0 and a third pulse 96 having a width 80c corresponding to a logic value 2. Thus, illustrative pulse train portion 90 comprises a series of three (3) pulses representing logic values 1, 0, 2 respectively.

Interpreting the pulses as state information and with reference to Table 1 above, a first pulse 92 having logic value 1 indicates that the direction of the target is negative with respect to the sensor. A second pulse 94 having logic value 0 indicates that the airgap between the target and sensor is within a predetermined acceptable range. And a third pulse 96 having logic value 2 indicates that the sensor is in mode 2 or some other function.

Alternatively, interpreting the pulses as bits in a data word and with reference to Table 2 above, pulse train portion 90 with pulses 92, 94, 96 having logic values 1, 0, 2 respectively corresponds to a code 7 or a $7^{th}$ word. This data may correspond to a particular diagnostics, test function or some other function.

In an embodiment, output pulse train portion 90 may be used as both state and/or word information depending on a particular application using the information. For example, both state information and words may be used simultaneously generated and transmitted on the same signal path for different applications. For example, output 90 may be received and translated by a receiver. The receiver may translate the information and provide it to different applications. Thus, a first application running in mission mode may interpret the logic values 1, 0, 2 as state information, including the negative direction of the target, the acceptable airgap properties and sensor mode 2. Alternatively, a second application running in test mode may interpret the same logic values (1, 0, 2) as code 7 or a $7^{th}$ word.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The term "magnetic field sensing element" is used herein, to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. The term "module" is sometimes used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed:

1. In a sensor for detecting a target, a method comprising:
    detecting a feature of the target;
    in response to detecting the feature, generating an output signal pulse train portion comprising two or more pulses with at least two of the plusses having different amplitudes and each of the two or more pulses having a width corresponding to a logic value, wherein at least a first one of the two or more pulses has a high amplitude and at least a second one of the two or more pulses, following the first one of the two or more pulses has a low amplitude;
    measuring widths of the two or more pulses in the output signal pulse train portion in response to at least one of the two or more pulses reaching a first amplitude threshold; and
    determining a logic value for each of the measured widths,
    wherein the output signal pulse train portion corresponds to a data word based upon the determined logic values for each of the measured widths of the two or more pulses,
    wherein the output signal pulse train includes at least N pulses and the data word is a base N data word, where N>1.

2. The method of claim 1, wherein at least two of the pulses have different widths corresponding to different logic values.

3. The method of claim 1, wherein the output signal pulse train portion comprises three pulses with a first pulse having a first width corresponding to a first logic value, a second pulse having a second width corresponding to a second logic value, and a third pulse having a third width corresponding to a third logic value.

4. The method of claim 1, wherein the output signal pulse train portion includes 3 pulses and the data word is a base 3 data word.

5. The method of claim 1, wherein the output signal pulse train portion corresponds to a device state, the device state corresponds to a state of the target object or a state of a sensor monitoring the target object.

6. The method of claim 1, further comprising determining a frequency of the target object base on the measured widths of the two or more pulses.

7. The method of claim 1, further comprising determining airgap properties between the target object and a sensor monitoring the target object based on the measured widths of the two or more pulses.

8. The method of claim 1, further comprising:
in response to detecting the feature, detecting a second feature after a predetermined time threshold; and
generating a time out function responsive to exceeding the predetermined time threshold, wherein the time function ignores the first feature and waits for a third feature detection.

9. The method of claim 1, further comprising generating a first pulse in the output signal pulse train portion responsive to the detected feature, wherein the feature is a leading edge of the target object and the first pulse with predetermined characteristics to identify the leading edge.

10. The method of claim 9, further comprising identifying the first pulse based on the first pulse having an amplitude greater than or equal to an amplitude threshold.

11. A system for providing information about a target object based on pulse widths, the system comprising:
a sensor disposed to detect a first feature of the target object and in response to the detected first feature, generate an output signal pulse train portion comprising at least one pulse train portion with each pulse train portion comprising two or more pulses with at least two of the pulses having different amplitudes and each of the two or more pulses having a width corresponding to a logic value, wherein at least a first one of the two or more pulses has a high amplitude and at least a second one of the two or more pulses, following the first one of the two or more pulses has a low amplitude;
wherein the system is configured to measure widths of the two or more pulses in the output signal pulse train portion in response to at least one of the two or more pulses reaching a first amplitude threshold and determine a logic value for each of the measured widths,
wherein the output signal pulse train portion corresponds to a data word based upon the determined logic values for each of the measured widths of the two or more pulses,
wherein the output signal pulse train includes at least N pulses and the data word is a base N data word, where N>1.

12. The system of claim 11, wherein the sensor comprises a magnetic field sensor.

13. The system of claim 12, wherein the magnetic field sensor comprises a single-chip Hall effect sensor integrated circuit.

14. The system of claim 12, wherein the magnetic field sensor comprises one or more Hall effect elements.

15. The system of claim 12, wherein the magnetic field sensor comprises three Hall effect elements, wherein each of the Hall effect elements are positioned along edges or at vertices of an equilateral triangle within the sensor.

16. The system of claim 15, wherein the three Hall effect elements are configured to detect a magnetic profile of the target object simultaneously but at different locations within the sensor.

17. The sensor of claim 12, wherein the sensor comprises one or more detection circuits coupled to the magnetic field sensor.

18. The system of claim 17, wherein the one or more detection circuits are configured to detect at least one of (a) a parameter of an environment in which the sensor is disposed, (b) the first feature of the target object, and (c) a parameter of a relationship between the sensor and the target object.

19. The system of claim 17, wherein the one or more detection circuits are configured to detect a direction of the target object relative to the sensor.

20. The system of claim 17, wherein the one or more detection circuits are configured to detect airgap properties between the target object and the sensor.

21. In a sensor, a method of providing information, the method comprising:
detecting a change in a condition experienced by the sensor; and
generating a plurality of pulses in response to the detected change, with a first one of the plurality of pulses having a first amplitude and second ones of the plurality of pulses having an amplitude different from the first amplitude with each of the second ones of the plurality of pulses having one of a plurality of different pulse width values, each of which represents a respective one of a plurality of different logic values:
measuring widths of the two or more pulses in the output signal pulse train portion in response to at least one of the two or more pulses reaching a first amplitude threshold; and
determining a logic value for each of the measured widths,
wherein the output signal pulse train portion corresponds to a data word based upon the determined logic values for each of the measured widths of the two or more pulses,
wherein the output signal pulse train includes at least N pulses and the data word is a base N data word, where N>1.

22. The method of claim 21, wherein the second ones of the plurality of pulses have the same amplitude.

23. The method of claim 21, wherein at least some of the pulse width values are multiples of each other.

24. The method of claim 21, wherein a first one of the first pulse width values is approximately twice as long as a second one of the pulse width values.

25. The method of claim 21, wherein a first one of the logic values corresponds to a logic zero value and a second one of the logic values corresponds to a logic one value.

26. The method of claim 21, wherein said data word conveys a direction of rotation of a target.

27. The method of claim 21, wherein the sensor corresponds to at least one of a pressure sensor, temperature sensor, bolometer or infrared sensor.

28. The method of claim 21, wherein the sensor corresponds to an accelerometer, gyroscope or gas sensor.

29. The method of claim 21, wherein the detected change is a change in a magnetic field.

30. The method of claim 21, wherein the condition includes at least one of: a change in temperature, a change in pressure, a change in a gas level, a change in a radiation level or a change in speed.

* * * * *

UNITED STATES PATENT AND TRADEMARK OFFICE
CERTIFICATE OF CORRECTION

PATENT NO. : 10,495,700 B2  
APPLICATION NO. : 15/010453  
DATED : December 3, 2019  
INVENTOR(S) : Seth Prentice et al.

Page 1 of 1

It is certified that error appears in the above-identified patent and that said Letters Patent is hereby corrected as shown below:

In the Specification

Column 1, Line 38, delete "which" and replace with --which is--.

Column 2, Line 34, delete "is responsive" and replace with --that is responsive--.

Column 3, Line 54, delete "or a change in a change" and replace with --or a change--.

Column 6, Line 42, delete "used" and replace with --use--.

Column 6, Line 52, delete "or a change in a change" and replace with --or a change--.

Column 8, Line 5, delete "While a" and replace with --A--.

Column 9, Line 9, delete "include" and replace with --including--.

Column 14, Line 59, delete "used".

In the Claims

Column 16, Line 36, in Claim 1, delete "plusses" and replace with --pulses--.

Signed and Sealed this  
Eighth Day of September, 2020

Andrei Iancu  
*Director of the United States Patent and Trademark Office*